(12) United States Patent
Ireland et al.

(10) Patent No.: US 7,073,117 B1
(45) Date of Patent: Jul. 4, 2006

(54) METHOD AND APPARATUS FOR GENERATING BIT ERRORS IN A FORWARD ERROR CORRECTION (FEC) SYSTEM TO ESTIMATE POWER DISSIPATION CHARACTERISTICS OF THE SYSTEM

(75) Inventors: Howard H. Ireland, Woodstock, GA (US); Jeffery T. Nichols, Marietta, GA (US)

(73) Assignee: Ciena Corporation, Linthicum, MD (US)

( * ) Notice: Subject to any disclaimer, the term of this patent is extended or adjusted under 35 U.S.C. 154(b) by 414 days.

(21) Appl. No.: 10/366,250

(22) Filed: Feb. 13, 2003

Related U.S. Application Data

(60) Provisional application No. 60/359,274, filed on Feb. 21, 2002.

(51) Int. Cl.
*H03M 13/03* (2006.01)
(52) U.S. Cl. .................................................. 714/786
(58) Field of Classification Search ................ 714/703, 714/786; 703/20, 21; 702/60
See application file for complete search history.

(56) References Cited

U.S. PATENT DOCUMENTS

| | | | | |
|---|---|---|---|---|
| 4,488,302 A | * | 12/1984 | Ahamed | 714/762 |
| 6,357,030 B1 | * | 3/2002 | Demura et al. | 714/755 |
| 6,799,287 B1 | * | 9/2004 | Sharma et al. | 714/703 |

OTHER PUBLICATIONS

ITU ANSI T1.105.08-2001, Synchronous Optical Network (SONET)- In-band Forward Error Correction Code Specifications☐☐.*
ALTERA White Paper titled "Enhancing High-Speed Telecommunications Networks with FEC" Feb. 2001 ver. 1.0.*
IEEE 802.3ah EFM Task Force Interim Meeting, Los Angeles Oct. 2001.*

* cited by examiner

*Primary Examiner*—Albert Decady
*Assistant Examiner*—Sam Rizk
(74) *Attorney, Agent, or Firm*—Merek, Blackmon & Voorhees, LLC

(57) ABSTRACT

A method and apparatus for generating and inserting bit errors in data words that have been encoded in a forward error correction (FEC) system in order to estimate power dissipation. In accordance with the present invention, it has been determined that a burst error generator that is capable of erroring the maximum number of correctable data bits in every FEC encoded frame, which allows the designer to accurately produce test vectors that are suitable for use in commercially available power estimation tools. In addition, after the IC is produced, the burst error generator of the present invention can be enabled to provide real-time FEC power dissipation data for use in system thermal modeling, thus obviating the need to use costly external devices that emulate a given error rate. Furthermore, the power dissipation data obtained in real-time may be used to refine the initial design power estimate, which will then allow the designer to develop a more accurate prediction of power consumption for future IC designs. Thus, the burst error generator of the present invention is capable of reducing iterations of IC designs by accurately estimating the worst-case power dissipation of FEC decoders.

25 Claims, 4 Drawing Sheets

US 7,073,117 B1

METHOD AND APPARATUS FOR GENERATING BIT ERRORS IN A FORWARD ERROR CORRECTION (FEC) SYSTEM TO ESTIMATE POWER DISSIPATION CHARACTERISTICS OF THE SYSTEM

CROSS-REFERENCE TO RELATED APPLICATIONS

This application claims priority to a provisional application that was filed on Feb. 21, 2002, entitled OC-192 Forward Error Correction and Sonet Transport Overhead ASIC Functional Specification, having Ser. No. 60/359,274, which is incorporated by reference herein in its entirety.

TECHNICAL FIELD OF THE INVENTION

The present invention relates to communications and, more particularly, to a method and apparatus for generating bit error sequences to test the forward error correction (FEC) system for power dissipation problems.

BACKGROUND OF THE INVENTION

When information is transmitted over a communications link between a receiver and a transmitter, the bits that describe the information being transmitted can be corrupted. In other words, the receiver may determine that a received bit that is supposed to be a binary 1 is a binary 0, and vice versa. Corruption of bits in a data stream may be caused by a variety of factors or components in the communications link. For example, in an optical fiber network, optical energy is transmitted in the form of optical pulses that have particular levels that correspond to binary 1 s and 0 s. If the level of the optical energy is too low, the receiver can have difficulty determining whether a pulse corresponds to a binary 1 or a binary 0. Repeaters, or amplifiers, normally are disposed at particular locations along the communications link that amplify the optical signals so that they are at the proper levels to enable the receiver to determine whether it has received a binary 1 or a binary 0. Typically, the optical signals are converted into electrical signals at the repeaters. The electrical signals are then amplified and converted into optical signals, which are then modulated back onto the optical fiber. Similarly, at the receiver, the optical signals typically are converted back into electrical signals, which the receiver compares to a threshold value to determine whether it has received a binary 1 or a binary 0.

Because it is possible for the bits to be corrupted, techniques have been developed and implemented that provide error correction. In other words, if a bit received by the receiver is erroneously determined to be a binary 1 when it was meant to be a binary 0 when it was transmitted, and vice versa, receivers utilize various techniques to determine whether a bit value has been incorrectly identified and to correct the bit value. One known technique used for such purposes is generally referred to as the "Automatic Request To Transmit" (ARM) technique. In accordance with this technique, when the receiver detects a bit error, it sends a signal to the transmitter that tells the transmitter to retransmit the block of data that contained the error. The receiver processes the retransmitted data block and detects bit errors. The data block may need to be retransmitted several times before the receiver determines that the data is without error. Of course, retransmitting data utilizes bandwidth and generally slows down the overall throughput of the communications system.

A technique known as Forward Error Correction (FEC) is commonly used in the communications industry to reduce errors in data being transmitted over a communications link without requiring retransmission of data. FEC not only detects bit errors, but corrects detected bit errors. One of the primary advantages of FEC over ARM is that no retransmission of data is required with FEC. This is because FEC techniques introduce redundancy in the data bits that enables the receiver of a communications system to detect errors in data being transmitted and to correct the detected errors. The redundancy generally is introduced by utilizing data bits from the data stream to encode the data stream. The receiver has a decoder that has intelligence with regard to the encoding scheme used by the transmitter, which enables the receiver to decode the data and detect and correct errors without the need for retransmission. Another advantage of FEC is that, because it does not require retransmission of data, simplex links can be used, which is desirable in certain situations, such as when the receivers are receive-only terminals.

Generally, FEC techniques and systems fall into two broad categories, namely, block coding and convolution coding. Various block coding and convolution coding techniques are currently in use in the communications industry. In the past, the use of block codes has generally been limited to use in communications systems that have relatively low data rates for various reasons, such as the aforementioned adverse effects on overall coding gain (signal-to-noise ratio, $E_b/N_o$), which is expressed in decibels (dB), for short data bursts and the reduced overall throughput that can result from the synchronization requirement. Convolution coding has generally been the preferred FEC technique for high data rate implementations. However, convolution coding results in higher output bit error rates (BER) than the output (BERs) that can be achieved using block coding. Some customers want FEC systems with very low BERs (e.g., $10^{-15}$), which generally cannot be achieved using convolution coding, but which can be achieved using block coding, such as Bose-Chaudhuri-Hocquenghem (BCH) block coding, for example.

However, FEC systems that implement block coding have, to date, required a large number of encoders and decoders to process the relatively large amount of data in a data block. For example, one known FEC system utilizes 16 parallel encoders to process a 128-bit data block (i.e., each encoder processing 8 bits of the code) in parallel. In order to implement 16 parallel encoders in this known FEC system, a very large number of logic gates are required, which is undesirable for at least two reasons, namely, (1) the design increases the amount of "real estate" needed on an integrated circuit (IC) to implement the encoders, and (2) the large number of gates consume a large amount of power. Furthermore, this known FEC system only achieved a data rate of 2.5 gigabits per second (Gb/s), which is too slow for certain communications systems, such as current 10 Gb/s and 40 Gb/s optical communications systems. When designing integrated circuits (ICs) with FEC systems that utilize long block codes, such as long BCH codes, for example, it is difficult to determine the maximum power dissipation of the IC. Long BCH decoders have a power dissipation that increases significantly with incoming bit error rate (BER) due to the extensive use of Exclusive-OR (XOR) trees that have a high switching factor.

It would be desirable when designing such an IC to be able to estimate the power dissipation with a high degree of accuracy in order to design the power distribution network of the IC properly. Otherwise, costly re-spins of the IC may be necessary due to excessive voltage drop from the IC package pins to the internal die of the IC. Accordingly, a need exists for a method and apparatus for generating bit errors that can be used to test the FEC system in order to estimate the power dissipations of the system to ensure that the power distribution network of the system is designed to meet the necessary power requirements.

SUMMARY OF THE INVENTION

The present invention provides a method and apparatus for generating and inserting bit errors into data words that have been encoded in a forward error correction (FEC) system in order to estimate power dissipation. In accordance with the present invention, it has been determined that a burst error generator that is capable of erroring the maximum number of correctable data bits in every FEC encoded frame, which allows the designer to accurately produce test vectors that are suitable for use in commercially available power estimation tools.

In addition, after the IC is produced, the burst error generator of the present invention can be enabled to provide real-time FEC power dissipation data for use in system thermal modeling, thus obviating the need to use costly external devices that emulate a given error rate. Furthermore, the power dissipation data obtained in real-time may be used to refine the initial design power estimate, which will then allow the designer to develop a more accurate prediction of power consumption for future IC designs. Thus, the burst error generator of the present invention is capable of reducing iterations of IC designs by accurately estimating the worst-case power dissipation of FEC decoders.

These and other features and advantages of the present invention will become apparent from the following description, drawings and claims.

DETAILED DESCRIPTION OF THE PREFERRED EMBODIMENT OF THE INVENTION

In accordance with the present invention, it has been determined that a burst error generator that is capable of erroring the maximum number of correctable data bits in every FEC encoded frame, will allow the designer to accurately produce test vectors that are suitable for use in commercially available power estimation tools. In addition, after the IC is produced, the burst error generator of the present invention can be enabled to provide real-time FEC power dissipation data for use in system thermal modeling, thus obviating the need to use costly external devices that emulate a given error rate. Furthermore, the power dissipation data obtained in real-time may be used to refine the initial design power estimate, which will then allow the designer to develop a more accurate prediction of power consumption for future IC designs. Thus, the burst error generator of the present invention is capable of reducing iterations of IC designs by accurately estimating the worst-case power dissipation of FEC decoders.

The present invention is not limited to any particular type of block coding. However, in order to provide an actual example of one way in which the present invention can be implemented, the present invention will be described herein with reference only to block coding commonly known in the FEC art as Bose-Chaudhuri-Hocquenghem (BCH) coding. However, those skilled in the art will understand, in view of the description provided herein, that the present invention is equally applicable to all types of block coding, and that the description of the present invention is being restricted only to BCH coding for purposes of brevity.

Figure 1:
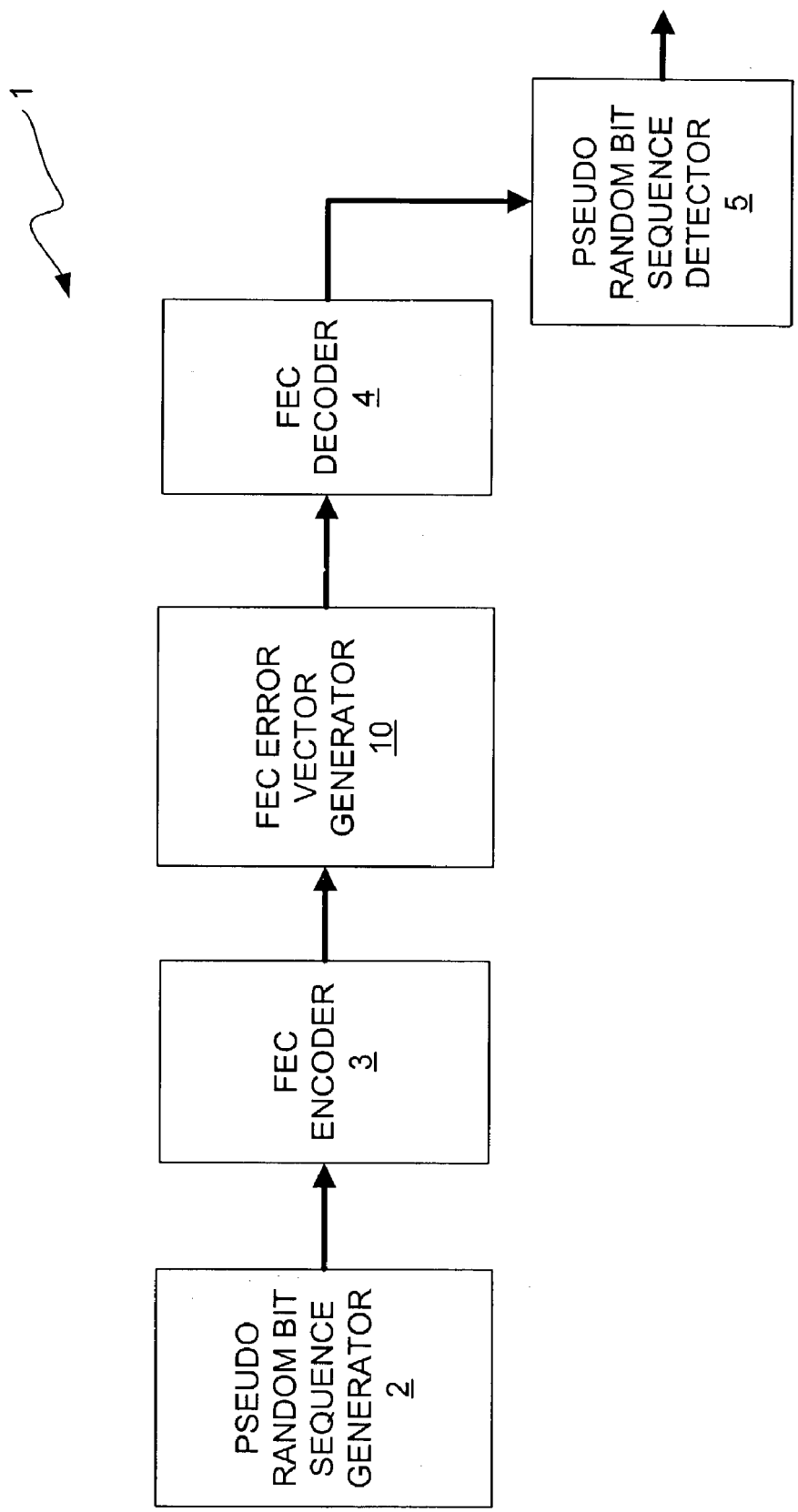
FIG. 1 is a block diagram of the apparatus of the present invention in accordance with an example embodiment.

FIG. 1 is a block diagram of the burst error generator apparatus 1 of the present invention in accordance with a first example embodiment. Preferably, the burst error generator is internal to the FEC system, which may be implemented in the form of a single IC, such as an application specific integrated circuit (ASIC). However, it is not necessary that the error generator of the present invention be internal to the FEC system. It should also be noted that an FEC system may be comprised of a single or multiple ICs and that the FEC encoder and decoder may be, but need not be, in the same IC.

The apparatus 1 comprises a pseudo random bit sequence (PRBS) generator 2 that generates a PRBS, which is then provided to the FEC encoder 3. The FEC encoder 3 encodes the PRBS by generating and inserting parity bits into the PRBS that will enable the FEC decoder 4 to decode the PRBS and make any necessary corrections. Prior to the FEC decoder 4 receiving the encoded PRBS, an FEC error vector generator 10 generates bit errors and inserts them into the PRBS. Generally, the greater the number of bit errors that are inserted into the PRBS, the harder the FEC decoder 4 will have to work to decode the PRBS and correct errors (i.e., the amount of switching by the logic gates will be very high). Consequently, a relatively large amount of power will be consumed. If the power distribution network (not shown) of the FEC system is not properly designed to handle such switching, the FEC system will not be able to correct all errors.

The output of the FEC decoder 4 is received by a pseudo random bit sequence detector 5, which evaluates the decoded PRBS and determines whether any errors were not corrected by the decoder 4. If the detector 5 determines that all errors were not corrected, the output of the detector 5 will provide such an indication. This indication informs the designer or user that there may be a problem with the power distribution network of the FEC system.

As stated above, preferably, the FEC vector generator 10 generates the maximum number of errors that it is possible to decode for the given FEC code being used by the FEC system in order to maximize the amount of switching being performed by the logic gates of the decoder 4. Thus, if a single error in a bit sequence goes uncorrected, preferably the user or designer is provided with an indication that there may be, or is, a problem with the power distribution network associated with the decoder 4. It should be noted, however, that this is not necessary, but is preferred because it increases the robustness of the testing apparatus 1, and thereby increases the likelihood that a power distribution network having a faulty design will not go undetected.

Figure 2:
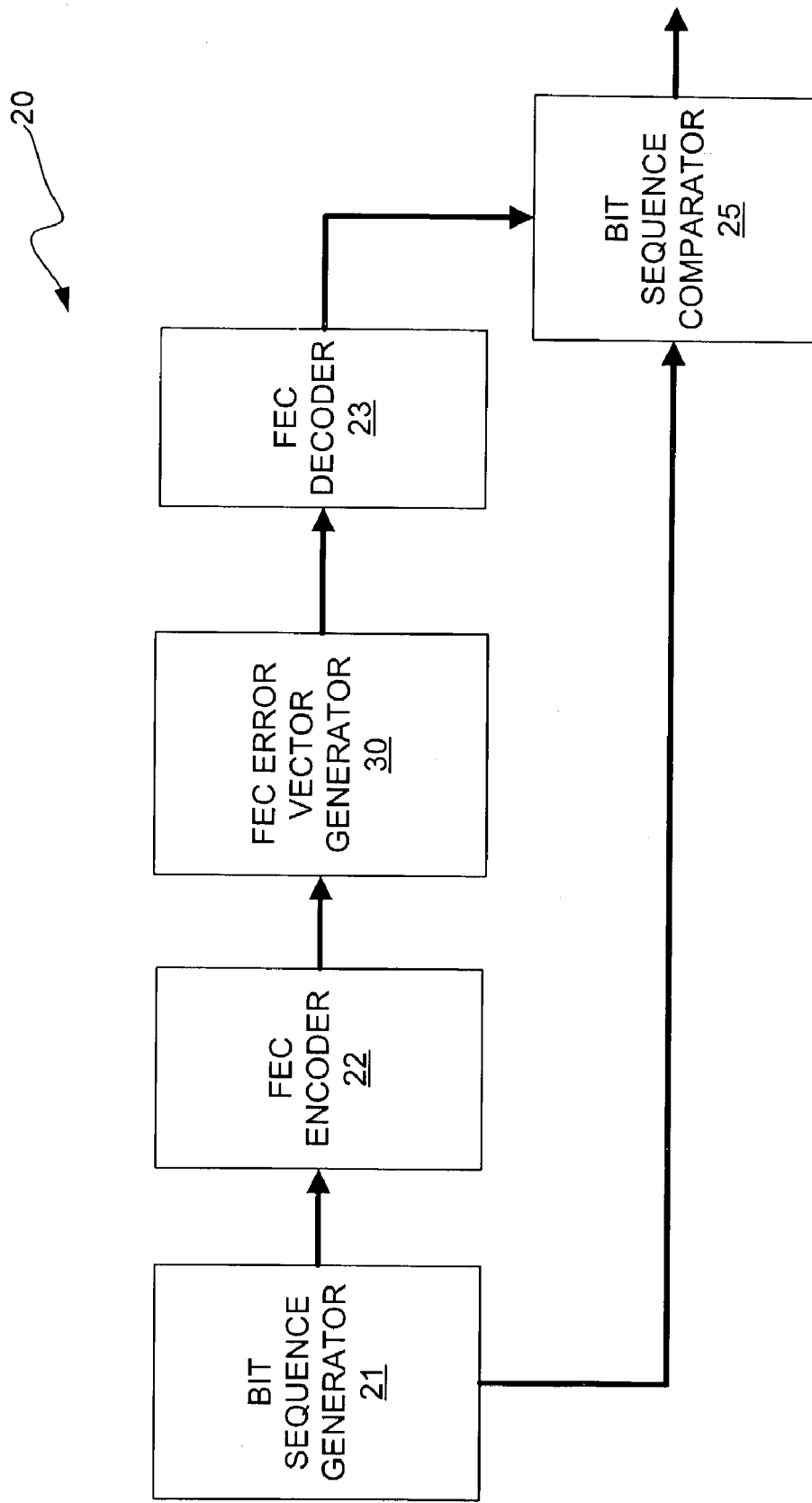
FIG. 2 is a block diagram of another example embodiment of the apparatus of the present invention.

FIG. 2 is a block diagram of another example embodiment of the burst error generator apparatus 20 of the present invention. In the embodiment shown in FIG. 1, the PRBS detector 5 has intelligence that enables it to know what the PRBS generated by the PRBS generator 2 should be once they have been properly decoded. In contrast, in accordance with the embodiment shown in FIG. 2, bit sequences that are generated by a bit sequence generator 21 are provided to a comparator 25, which compares the generated bit sequence with the decoded bit sequence to determine whether errors in the bit sequences have been corrected. The components 22, 30 and 23 may be identical to components 3, 10 and 4, respectively, shown in FIG. 1. As in the embodiment shown in FIG. 1, in the embodiment shown in FIG. 2, an indication is output from the apparatus 20, as indicated by the arrow pointing away from comparator 25, that informs the designer when an error was not corrected. Again, preferably the maximum number of errors are generated and inserted into the PRBS by the FEC vector generator 30 to maximize the amount of switching performed by the logic gates of the FEC decoder 23 in order to maximize power consumption.

Figure 3:
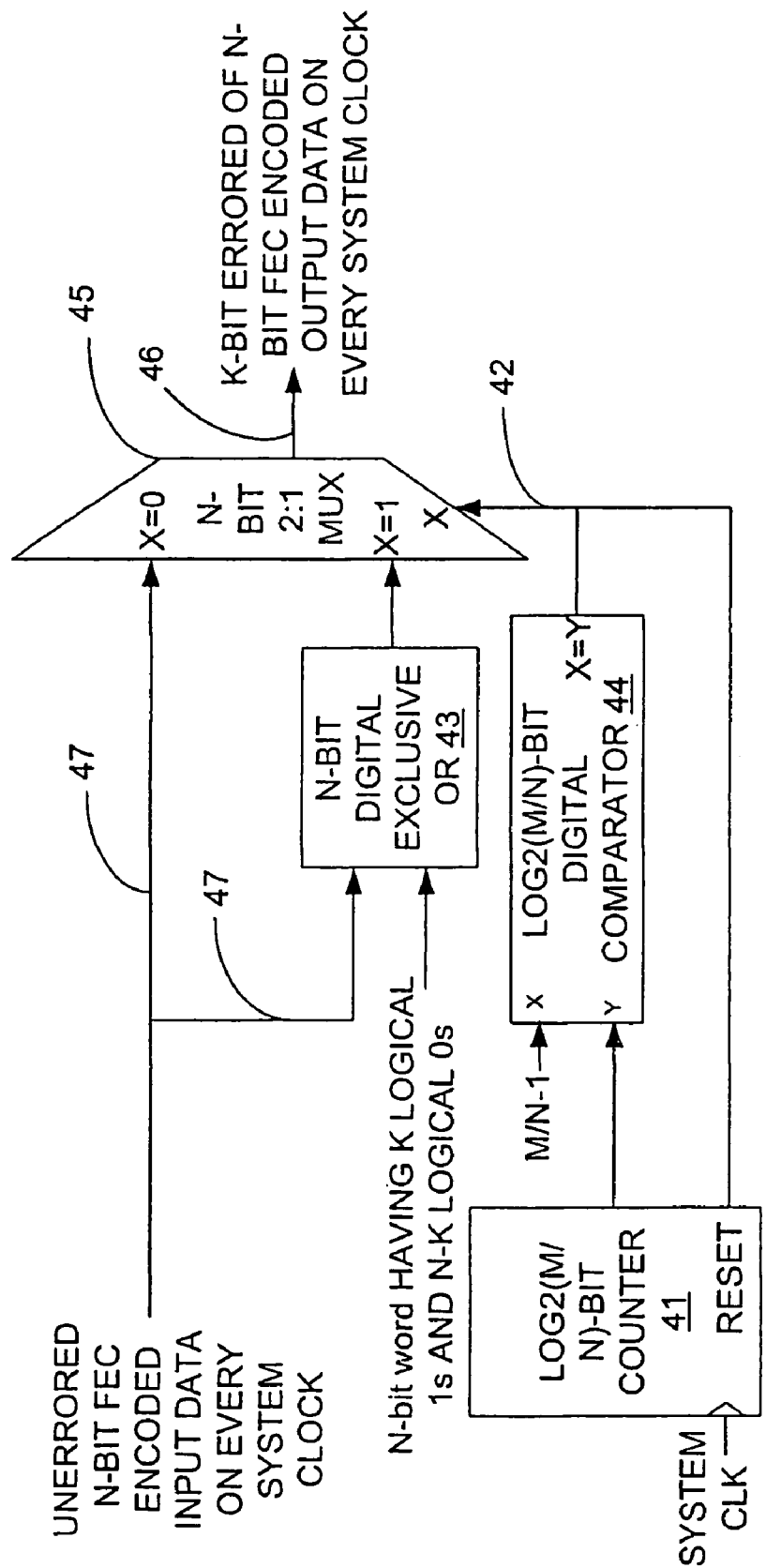
FIG. 3 illustrates a detailed block diagram of an example embodiment of the FEC error vector generator of the present invention shown in FIGS. 1 and/or 2.

FIG. 3 illustrates a detailed block diagram of an example embodiment of the FEC error vector generator 10 (or 30) of the present invention shown in FIGS. 1 and/or 2. In accordance with this embodiment, the error generator errors an encoded data stream 47 with a contiguous set of errors equal to the maximum bit error correction capability of the BCH FEC code, including any FEC frame interleaving. The BCH code has an error correction capability of K bits out of a block of M bits. The width of internal processing data path of the error generator 10 in this example is N. In this example embodiment, N=128, M=7680, K=39. The error generator 10 shown in FIG. 3 is configured to process a single N-bit word. In reality, because many N-bit encoded words are included in the M-bit encoded block, an error generator 10 such as that shown in FIG. 3 would be needed to process each of the N-bit encoded words included in the M-bit encoded block. For ease of illustration and discussion, only the logic used to process a single N-bit word of the M-bit block is shown in FIG. 3.

The apparatus 10 comprises a $\log_2(M/N)$ bit counter 41. When a count of M/N-1 is reached, the counter 41 is reset to 0, and a word containing K consecutive binary 1 s and N-K consecutive binary 0 s is modulo-2 added to the outgoing data stream by the N-bit Exclusive-OR (XOR) component 43. As can be seen in FIG. 3, when the comparator 44 determines that the value Y being output from the counter 41 is equal to the value of X, which corresponds to M/N-1, then the logic value on line 42 is a logic 1 and the node of the multiplexer 45 labeled X=1 is selected and the output 46 of the multiplexer 45 will be the output of the XOR block 43 (i.e., the errored data stream). This results in erroring K consecutive bits in the M-bit FEC encoded data stream. As long as the comparator 44 determines that X is not equal to Y, the node of the multiplexer labeled X=0 will be selected and the output of the multiplexer 45 will be the unerrored N-bit encoded input data stream 47. Thus, the X=0 node of the multiplexer 45 is selected under normal operations when the FEC decoder is not being tested.

If the FEC encoded blocks are bit interleaved B times, then the number of consecutive errors generated is given by K*B. If the total number of consecutive error bits required exceed N, then N error bits are inserted at count 0 and K*B−N bits are inserted at count 1. If the total number of consecutive errors exceed 2N, then N error bits are inserted at count 0, N error bits are inserted at count 1, K*B−2N error bits are inserted at count 2, and so forth.

Figure 4:
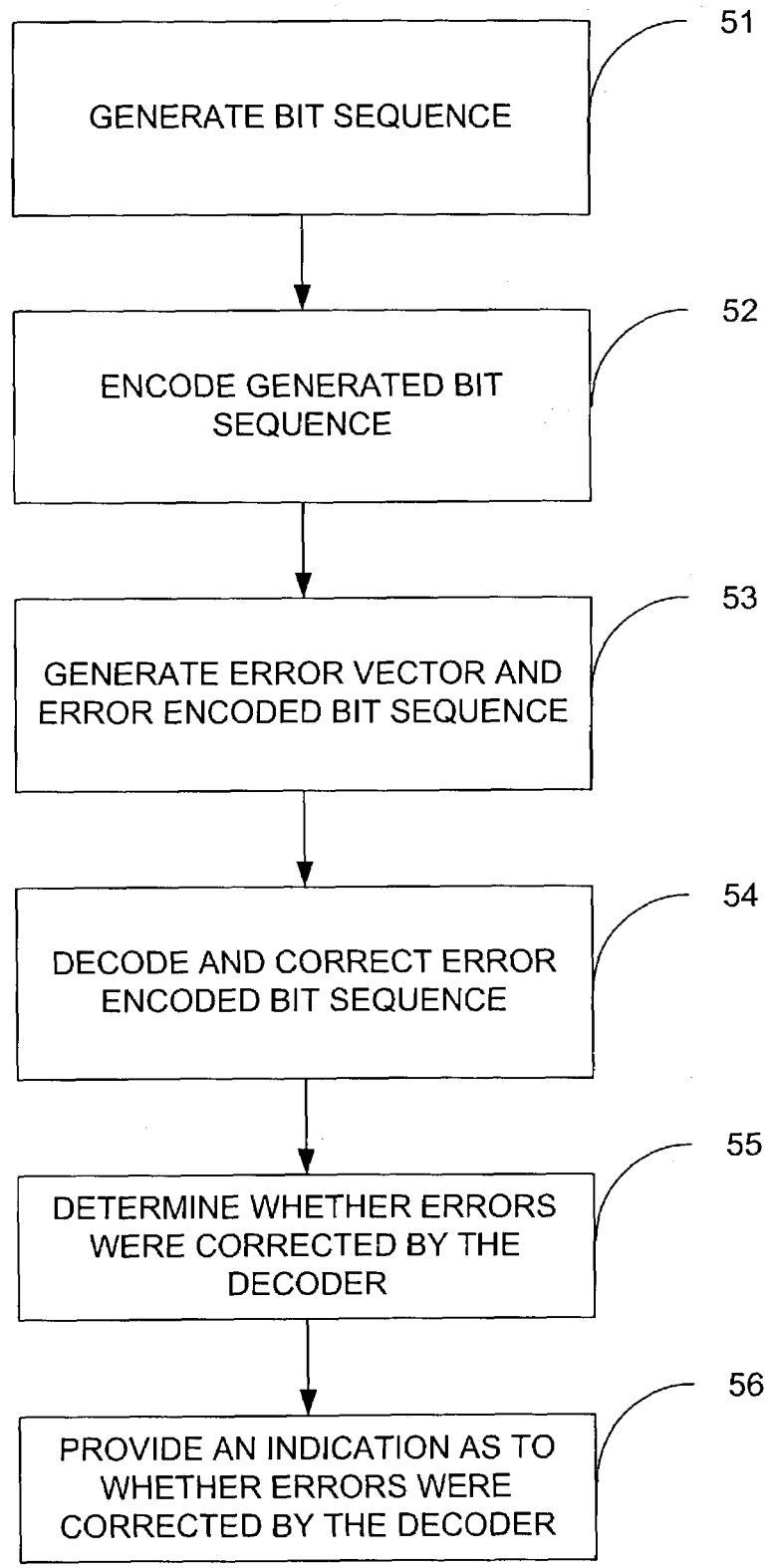
FIG. 4 is a flow chart illustrating the method of the present invention in accordance with the preferred embodiment.

FIG. 4 is a flow chart demonstrating the method of the present invention in accordance with the preferred embodiment. It should be noted that although the ordering of the blocks of the flow chart implies that the steps of the method are performed in some particular sequence, the method is not limited in this regard. Some of the steps may be performed in parallel with other steps, or in an order other than that implied by the ordering of the blocks in FIG. 4. As indicated by block 51, a bit sequence is generated, which may be a PRBS or otherwise. The bit sequence is then encoded by the FEC encoder, as indicated by block 52. An FEC error vector is generated and the encoded bit sequence is errored by the generated FEC vector, as indicated by block 53. The errored bit sequence is then decoded and corrected, as indicated by block 54. A determination is then made as to whether the errors were corrected, as indicated by block 55. An indication is then provided that indicates to a designer or user whether the errors were corrected, as indicated by block 56.

It should be noted that the present invention has been described with reference to particular embodiments for the purposes of demonstrating the principles and concepts of the present invention. Those skilled in the art will understand that present invention is not limited to these example embodiments. Also, those skilled in the art will understand, in view of the present disclosure, that a variety of logical configurations can be used to achieve the goals of the present invention. FIG. 3 is merely one example of the way in which errors can be generated and inserted into the encoded data stream. It should also be noted that although the present invention has been described herein as being performed in hardware in an ASIC, the present invention may be implemented in hardware, in a combination of hardware and software, in a microprocessor, in a field programmable gate array, etc. Those skilled in the art will understand the way in which the tasks discussed herein can be performed by a variety of such physical implementations. Those skilled in the art will understand that a variety of changes can be made to the configurations showed in FIG. 3 and that all such modifications are within the scope of the present invention.

What is claimed is:

1. An apparatus for testing sufficiency of power distribution in a forward error correction (FEC) system, the apparatus comprising:

a bit sequence generator configured to generate bit sequences;

an FEC encoder, the FEC encoder being configured to encode bit sequences generated by the bit sequence generator;

an FEC error vector generator, the FEC error vector generator being configured to generate error vectors and to utilize the error vectors to insert a number of errors into the encoded bit sequences to produce encoded bit error sequences;

an FEC decoder, the FEC decoder being configured to decode the encoded bit error sequences and to correct any errors in the decoded sequences when the power supply is sufficient and to not correct all of the errors when the power supply is insufficient; and a detector, the detector being configured to analyze the decoded sequences and determine whether bit errors exist in the decoded sequences; and an indicator for indicating insufficient power distribution when the detector determines bit errors exist in the decoded sequence.

2. The apparatus of claim 1, wherein the FEC error vector generator inserts a maximum number of errors into each encoded bit error sequence that can be corrected for a given FEC block coding technique being used by the FEC system.

3. The apparatus of claim 2, wherein the FEC block coding is Bose-Chaudhuri-Hocquenghem (BCH) coding.

4. The apparatus of claim 1, wherein the FEC error vector generator inserts errors into an encoded bit sequence by modulo-2 adding bit errors to the encoded bit sequence.

5. The apparatus of claim 4, wherein the FEC error vector generator comprises Exclusive-OR logic that performs the modulo-2 addition, wherein the encoded bit sequence has N bits and wherein the modulo-2 addition inserts an N-bit word into the encoded bit sequence, the N-bit word having K binary 1 s and N-K binary 0 s.

6. The apparatus of claim 5, wherein the FEC error vector generator comprises a log2(M/N) bit counter that dictates when the modulo-2 addition is to occur, wherein M is an integer corresponding to a total number of bits in an M-bit encoded data block, the M-bit data block comprising X N-bit words, x being an integer corresponding to the number of N-bit words contained in the M-bit data block, and wherein when the counter reaches a count of M/N−1, the count is reset to zero and said N-bit word having K binary 1 s and N-K binary 0 s is modulo-2 added to the N-bit encoded data stream.

7. The apparatus of claim 1, wherein the number of errors inserted by the FEC error vector generator is a number that maximizes an amount of switching performed by the logic gates in the FEC decoder.

8. A method for measuring power consumption in a forward error correction (FEC) system, the method comprising the steps of:
generating bit sequences;
FEC encoding the bit sequences to produce encoded N-bit sequences;
generating a number of bit errors and inserting the number of bit errors into the encoded N-bit sequences to produce encoded N-bit error sequences containing a number K of bit errors;
using an FEC decoder to FEC decode the encoded bit error sequences and correcting errors in the decoded sequences; and
analyzing the decoded sequences to determine whether bit errors exist in the decoded sequences that were not corrected,
and measuring the power consumption of the FEC system used in correcting errors in the decoded sequences.

9. The method of claim 8, wherein a maximum number of errors that can be corrected for a given FEC block coding technique being implemented in the FEC system are inserted into each encoded N-bit sequence, K being equal to the maximum number of bits that can be corrected in an N-bit sequence for the given FEC block coding technique being used.

10. The method of claim 9, wherein the FEC block coding technique is a Bose-Chaudhuri-Hocquenghem (BCH) coding technique.

11. The method of claim 8, wherein the errors are inserted into an encoded bit sequence by modulo-2 adding bit errors to the encoded bit sequence.

12. The method of claim 11, wherein the encoded bit sequence has N bits and wherein the modulo-2 addition is performed by Exclusive-ORing an N-bit word with the N-bit encoded bit sequence, said N-bit word having K binary 1 s and N-K binary 0 s.

13. The method of claim 12, wherein a $\log_2(M/N)$ bit counter is used to determine when the modulo-2 addition is to occur, wherein M is an integer corresponding to a total number of bits in an M-bit encoded data block, the M-bit data block comprising X N-bit words, X being an integer corresponding to the number of N-bit words contained in the M-bit data block, and wherein when the counter reaches a count of M/N−1, the count is reset to zero and said N-bit word having K binary 1 s and N-K binary 0 s is Exclusive-ORed with the encoded N-bit sequence.

14. The method of claim 8, wherein the number of inserted bit errors is a number that maximizes an amount of switching performed by the logic gates in the FEC decoder.

15. The method for estimating power consumption of claim 8, further comprising the steps of comparing the measured power consumption to a theoretical power consumption of the FEC system.

16. The method for estimating power consumption of claim 8, further comprising the step of calculating a theoretical power consumption for the FEC system and comparing the measured power consumption to the theoretical power consumption.

17. The method for estimating power consumption of claim 8, further comprising the step of increasing the power input to the FEC system and comparing the number of bit errors not correct in the decoded sequences to number of bit errors not corrected in the decoded sequence prior to increasing the power input to the FEC system.

18. The method for estimating power consumption of claim 8, further comprising the step of providing a circuit in the FEC decoder sensitive to power consumption supply, wherein the FEC decoder is configured to decode the encoded bit error sequences and to correct all errors in the decoded sequences when the power supply is sufficient and to not correct all of the errors when the power supply is insufficient.

19. An apparatus for generating and inserting bit errors in data words that have been encoded in a forward error correction (FEC) system, the apparatus comprising:
a bit sequence generator configured to generate bit sequences;
an FEC encoder, the FEC encoder being configured to encode bit sequences generated by the bit sequence generator;
an FEC error vector generator, the FEC error vector generator being configured to generate error vectors and to utilize the error vectors to insert a number of errors into the encoded bit sequences to produce encoded bit error sequences;
an FEC decoder, the FEC decoder being configured to decode the encoded bit error sequences and to correct any errors in the decoded sequences; and
a detector, the detector being configured to analyze the decoded sequences and determine whether bit errors exist in the decoded sequences,
wherein the number of errors inserted by the FEC error vector generator is a number that increases an amount of switching to be performed by logic gates in the FEC decoder beyond a nominal amount, and
wherein if the detector determines that a single bit error was not corrected by the FEC decoder, the detector provides an indication that indicates to a user that a power distribution network that distributes power to the FEC decoder is not properly designed.

20. A method for measuring power consumption in a forward error correction (FEC) system, the method comprising the steps of:
generating bit sequences;
FEC encoding the bit sequences to produce encoded N-bit sequences;
generating a number of bit errors and inserting the number of bit errors into the encoded N-bit sequences to produce encoded N-bit error sequences containing a number K of bit errors;

using an FEC decoder to FEC decode the encoded bit error sequences and correcting errors in the decoded sequences; and analyzing the decoded sequences to determine whether bit errors exist in the decoded sequences that were not corrected, and measuring the power consumption of the FEC system used in correcting errors in the decoded sequences, and wherein if a determination is made during the analysis step that a single bit error was not corrected by the FEC decoder, an indication is provided that indicates to a user that a power distribution network that distributes power to the FEC decoder is not properly designed.

21. An apparatus for generating and inserting bit errors in data words that have been encoded in a forward error correction (FEC) system, the apparatus comprising:

a bit sequence generator configured to generate bit sequences;

an FEC encoder, the FEC encoder being configured to encode bit sequences generated by the bit sequence generator;

an FEC error vector generator, the FEC error vector generator being configured to generate error vectors and to utilize the error vectors to insert a number of errors into the encoded bit sequences to produce encoded bit error sequences;

an FEC decoder, the FEC decoder being configured to decode the encoded bit error sequences and to correct any errors in the decoded sequences; and a detector, the detector being configured to analyze the decoded sequences and determine whether bit errors exist in the decoded sequences, wherein the number of errors inserted by the FEC error vector generator is a number that increases an amount of switching to be performed by logic gates in the FEC decoder beyond a nominal amount, and wherein the number of errors inserted by the FEC error vector generator is a number that facilitates detection of a faulty design in a power distribution network that distributes power to the FEC decoder.

22. A method for measuring power consumption in a forward error correction (FEC) system, the method comprising the steps of:

generating bit sequences;

FEC encoding the bit sequences to produce encoded N-bit sequences;

generating a number of bit errors and inserting the number of bit errors into the encoded N-bit sequences to produce encoded N-bit error sequences containing a number K of bit errors;

using an FEC decoder to FEC decode the encoded bit error sequences and correcting errors in the decoded sequences; and analyzing the decoded sequences to determine whether bit errors exist in the decoded sequences that were not corrected, and measuring the power consumption of the FEC system used in correcting errors in the decoded sequences, and wherein the number of inserted bit errors is a number that facilitates detection of a faulty design in a power distribution network that distributes power to the FEC decoder.

23. A computer program for generating and inserting bit errors in data words that have been encoded in a forward error correction (FEC) system, the computer program being embodied on a computer-readable medium, the program comprising:

a first code segment for generating bit sequences;

a second code segment for FEC encoding the bit sequences to produce encoded N-bit sequences;

a third code segment for generating bit errors and inserting the bit errors into the encoded N-bit sequences to produce encoded N-bit error sequences containing a number K of bit errors;

a fourth code segment for FEC decoding the encoded bit error sequences and correcting errors in the decoded sequences; and a fifth code segment for analyzing the decoded sequences to determine whether bit errors exist in the decoded sequences that were not corrected, wherein the number K of bit errors is designed to maximize power consumption related to the FEC decoding, and wherein a determination is made during the analysis that one or more bit errors were not corrected by the fourth code segment causes the fifth code segment to detect a faulty design in a power distribution network.

24. A method for testing power consumption sufficiency in a forward error correction (FEC) system, the method comprising the steps of:

generating bit sequences;

FEC encoding the bit sequences to produce encoded N-bit sequences;

determining the maximum number of bit errors K that can be corrected by the FEC system for the N-bit sequences;

generating at least K bit errors and inserting K bit errors into the encoded N-bit sequences to produce encoded N-bit error sequences containing K of bit errors;

using an FEC decoder to FEC decode the encoded bit error sequences and correcting errors in the decoded sequences; and analyzing the decoded sequences to determine whether bit errors exist in the decoded sequences that were uncorrected, wherein the number of inserted bit errors is a number that increases an amount of switching to be performed by logic gates in the FEC decoder beyond a nominal amount; and determining whether the power consumption of the FEC system used in correcting the K bit errors in the decoded sequences was sufficient based whether any uncorrected errors were not found in the decoded sequence analysis.

25. The method for estimating power consumption of claim 24, further comprising the step of providing an indication that there is power distribution error if bit errors were not corrected by the FEC system.

* * * * *